(12) United States Patent
Boehme et al.

(10) Patent No.: US 9,871,353 B2
(45) Date of Patent: Jan. 16, 2018

(54) BOTTOM ASSEMBLY FOR THE FRAME OF A SWITCH CABINET

(71) Applicant: RITTAL GMBH & CO. KG, Herborn (DE)

(72) Inventors: Siegfried Boehme, Wolfen (DE); Daniel Brueck, Giessen (DE); Wolfgang Reuter, Liebenscheid (DE); Timo Schindler, Bischoffen (DE)

(73) Assignee: RITTAL GMBH & CO. KG (DE)

( * ) Notice: Subject to any disclaimer, the term of this patent is extended or adjusted under 35 U.S.C. 154(b) by 0 days.

(21) Appl. No.: 15/116,754

(22) PCT Filed: Jan. 28, 2015

(86) PCT No.: PCT/DE2015/100035
§ 371 (c)(1),
(2) Date: Aug. 4, 2016

(87) PCT Pub. No.: WO2015/117598
PCT Pub. Date: Aug. 13, 2015

(65) Prior Publication Data
US 2016/0352082 A1 Dec. 1, 2016

(30) Foreign Application Priority Data

Feb. 5, 2014 (DE) .......... 10 2014 101 405

(51) Int. Cl.
*H02B 1/00* (2006.01)
*H02B 1/30* (2006.01)
(Continued)

(52) U.S. Cl.
CPC ............ *H02B 1/303* (2013.01); *H02B 1/01* (2013.01); *H02B 1/013* (2013.01); *H02B 1/014* (2013.01); *H05K 7/183* (2013.01)

(58) Field of Classification Search
CPC .......... H02B 1/30; H02B 1/301; H02B 1/305; H02B 1/308; H02B 1/014; H02B 1/01; H02B 1/013; H05K 7/18; H05K 7/183
See application file for complete search history.

(56) References Cited

U.S. PATENT DOCUMENTS 4,899,900 A * 2/1990 Debus ............... H05K 7/183
220/4.02
5,004,107 A * 4/1991 Sevier ............... A47B 55/00
211/26

(Continued)

FOREIGN PATENT DOCUMENTS

| DE | 4140072 C2 | 9/1993 |
| DE | 29509555 U1 | 8/1995 |
| DE | 19813222 C1 | 11/1999 |

OTHER PUBLICATIONS

International Search Report (in English and German) and Written Opinion (in German) for PCT/DE2015/100035, dated Apr. 10, 2015; ISA/EP.

(Continued)

*Primary Examiner* — Leslie A Nicholson, III
*Assistant Examiner* — Kimberley S Wright
(74) *Attorney, Agent, or Firm* — Harness, Dickey & Pierce, P.L.C.

(57) ABSTRACT

A base assembly for the rack of a switchgear cabinet, comprising horizontal frame profiles which have the height h and which surround a base section of the rack, wherein at the height h, the frame profiles have a first horizontal mounting plane, is characterized in that, spaced from the first horizontal mounting plane, at least one additional mounting plane is provided, on or adjoining a fixed support which is formed at least sectionally on one or more of the frame profiles and projects into the base section.

21 Claims, 11 Drawing Sheets

(51) Int. Cl.
*H02B 1/01* (2006.01)
*H05K 7/18* (2006.01)

(56) References Cited

U.S. PATENT DOCUMENTS

| | | | | |
|---|---|---|---|---|
| 5,380,083 | A | 1/1995 | Jones et al. | |
| 6,030,063 | A * | 2/2000 | Benner | H02B 1/30 211/189 |
| 6,409,416 | B1 * | 6/2002 | Reuter | H02B 1/303 211/189 |
| 7,441,847 | B2 * | 10/2008 | Francisquini | H02B 1/01 312/265.3 |
| 8,944,533 | B2 * | 2/2015 | Hofmann | H02B 1/01 312/265.1 |
| 2005/0174020 | A1 * | 8/2005 | Francisquini | H02B 1/01 312/265.3 |

OTHER PUBLICATIONS

International Preliminary Report on Patentability (Chapter II) (in German) for PCT/DE2015/100036, dated Apr. 25, 2016; IPEA/EP.

* cited by examiner

BOTTOM ASSEMBLY FOR THE FRAME OF A SWITCH CABINET

CROSS-REFERENCE TO RELATED APPLICATIONS

This application is a 371 U.S. National Stage of International Application No. PCT/DE2015/100035, filed on Jan. 28, 2015, which claims priority to German Application No. 10 2014 101 405.7, filed on Feb. 5, 2014. The entire disclosures of the above applications are incorporated herein by reference.

FIELD

The disclosure relates to a base assembly for the rack of a switchgear cabinet, comprising horizontal frame profiles which have the height h and which surround a base section of the rack, wherein at the height h, the frame profiles have a first horizontal mounting plane.

BACKGROUND

This section provides background information related to the present disclosure which is not necessarily prior art.

Base assemblies of this type are known, for example from DE 198 13 222 C1. In said document, the lower part of the rack of a switchgear cabinet is assembled from horizontal frame profiles, which are seated on a base frame that has specially designed corner pieces, which in turn support fastening straps that are connected by screws to the horizontal frame profiles. On the upper side of the horizontal frame profiles, a plurality of fastening recesses are provided, which therefore define a first horizontal mounting plane. The base assembly is complemented by vertical frame profiles and a top assembly comprising horizontal frame profiles to form a rack.

Another base assembly of the aforementioned type is known from DE 41 40 072 C2. In said document, horizontal frame profiles and vertical frame profiles are provided, which form frames on the front and back sides of the rack. These frames are connected to one another at the corners by means of depth braces. These depth braces are bent multiple times and form a structure that allows a side wall to be inserted into a molded groove. The guide bar for the depth braces is equipped with a row of fastening receptacles and may also be used for attaching parts.

SUMMARY

This section provides a general summary of the disclosure, and is not a comprehensive disclosure of its full scope or all of its features.

Proceeding from this prior art, it is the object of the invention to provide a base assembly which has expanded mounting options with a simple structure.

According to the disclosure, at least one additional mounting plane is provided, spaced from the first horizontal mounting plane and on or adjoining a fixed support which is formed at least sectionally on one or more of the frame profiles and projects into the base section. At least one additional mounting plane is thereby provided, optionally around the entire base perimeter, which is offset "downward" from the first horizontal mounting plane, and which, as will be explained in greater detail below, can accommodate base plates, but also chassis, mounting rails and cable routing tracks, and may also be used for selective cable separation.

It is advantageously also provided that at least one, but preferably all of the additional mounting planes extend parallel to the first horizontal mounting plane.

Further advantageously, the fixed support is formed on the horizontal frame profiles around the entire base perimeter in order to provide a continuous mounting frame.

An extremely wide range of fixed support configurations is possible, for example, the fixed support may be formed by a profile sheet that is folded over 180 degrees. Since the frame profiles are generally hollow profiles, the fixed support may also be formed by at least one bent region of a profile sheet, so that the fixed support itself forms a hollow profile. In both variants, two horizontal mounting planes may be formed on the fixed support. In such an embodiment, the base assembly according to the disclosure thus has at least three horizontal mounting planes, which can be complemented by vertical mounting planes, wherein the fixed support may also have a vertical mounting plane between the two horizontal mounting planes.

The horizontal mounting planes of the fixed support preferably extend parallel to one another and parallel to the first mounting plane.

In terms of the system concept, it is advantageous for the horizontal mounting planes to have fastening receptacles, for example, 19" system holes or metric system holes.

To increase the stability of the base assembly, at least one of the horizontal profiles may have a profile chamber which is subdivided by a reinforcing brace that extends vertically in the manner of a partition.

According to a further aspect of the disclosure, one or more of the horizontal frame profiles of the base assembly may have a profile chamber with a base extending therefrom which has a standing surface and a bearing surface, wherein at least the standing surface extends beyond the width of the profile chamber in at least one widthwise direction. With such an embodiment, the torsional stability of the profile is increased, while at the same time ensuring that the base assembly can be assembled with a relatively large standing surface, for example on the raised floor of a computer center, without losing installation space for the interior fittings of a switchgear cabinet or rack.

It is also particularly preferred for one horizontal mounting plane to be located on the bearing surface, so that, for example, a base plate can be placed directly on the horizontal frame profile and optionally secured there without substantial assembly effort.

In at least one of the additional mounting planes an interior fitting component may be secured, with possible interior fitting components including mounting rails, chassis, cable routing tracks, or the like. The disclosure offers a particular advantage, however, when combined with a base plate as an interior fitting component, which serves to partially or fully cover the base section.

According to a preferred embodiment, the base plate is bent on at least one of its sides, and is more preferably bent multiple times to give it greater stability so that the base plate may even be walked on during assembly.

The flexibility for expansion of the base group is increased by providing at least two base plates which are attached so as to slide relative to one another. Rather than providing cut-outs or punched openings for the insertion of cables, the base plates can first be moved away from one another to create a slot or shaft for cable insertion, and can then be pushed as close as possible to one another, so that at least an effective dust seal is produced.

It may also be provided that one of the base plates overlaps another base plate and forms a sliding plate, as it were, which is guided on a base plate by means of an edge bent multiple times, for example.

A particular embodiment provides that a base plate is attached in each of at least two additional mounting planes, forming an at least partially sealed space between the base plates. This allows cables to be selectively separated, for example between data lines and power cables.

The base plate further has at least one relocatable divider brace that subdivides the base plate so that it can be used for separate storage of tools and materials related to the wiring in the cabinet, or may also provide reserve storage for cable. Advantageously, the base plate is configured in the form of a tray. It is understood that such a base plate can be installed in two installation directions, in other words as an "upward" facing tray and as a "downward" facing tray.

To enable cable routing without damage, the edges of such a tray along with the edges of base plate sides that are bent only once may be rounded.

Likewise according to the system concept, the base plates are provided in only a few sizes, which can then be combined depthwise and widthwise. Once the plates have been mounted, they can be secured with self-locking clamping parts, which can be attached without tools in the grid of holes in the system.

DRAWINGS

The drawings described herein are for illustrative purposes only of selected embodiments and not all possible implementations, and are not intended to limit the scope of the present disclosure.

In the following, the disclosure will be specified in greater detail by way of example, with reference to the accompanying drawings. The diagrams are not necessarily to scale; the are intended merely to illustrate the principles of the disclosure. The drawings show.

DETAILED DESCRIPTION

Example embodiments will now be described more fully with reference to the accompanying drawings.

Figure 1:
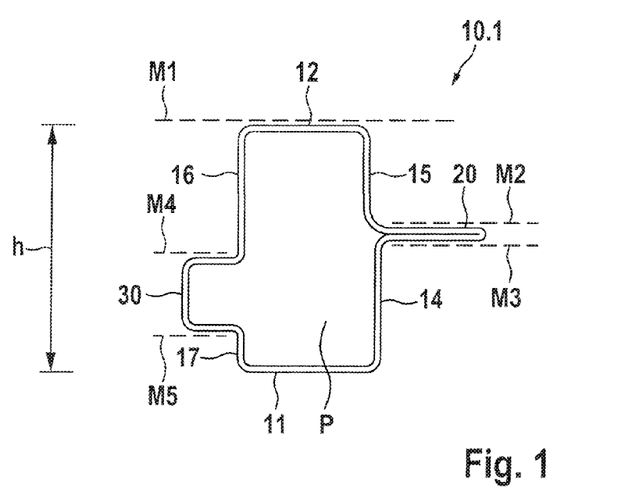
FIG. 1 a cross-sectional view of a horizontal frame profile according to a first embodiment of the present disclosure.

FIG. 1 shows a cross-sectional view of a horizontal frame profile 10.1, which is bent and stamped from sheet metal and is embodied as a hollow profile, the horizontal frame profile 10 having a substantially rectangular profile chamber P. Profile chamber P is bounded by a first profile side 11 which, when horizontal frame profile 10 is used as intended, faces the floor surface of an assembly area, and which will also be referred to in the following as the standing surface. This first profile side 11 is situated opposite a profile side 12, which extends parallel to the first profile side 10. Profile sides 11, 12 define the height h of horizontal frame profile 10.1. In profile side 12, fastening receptacles are provided (not shown in the figure), so that a first horizontal mounting plane M1 is defined there. Profile chamber P is further bounded by a wall 14 that proceeds vertically from profile wall 11 and merges into a first fixed support 20, which is formed by a section of the profile sheet being folded back 180°, and which extends substantially perpendicular to profile side 14. Joined with fixed support 20, roughly aligned with profile side 14, is a profile side 15, which leads to profile side 12. Profile side 12 in turn merges into a profile side 16, which extends roughly perpendicular thereto and which leads to a further fixed support 30, which is formed as a hollow profile by the profile sheet being bent multiple times, and which merges into a profile side 17, which is substantially aligned with profile side 16 and leads at a right angle to profile side 10. Each of profile sides 14, 15, 16, 17 may, but need not necessarily, be provided with fastening receptacles. If fixed supports 20, 30 are likewise provided with fastening receptacles, they define additional horizontal mounting planes, specifically a mounting plane M2 on the upper side of fixed support 20 and a mounting plane M3 extending parallel thereto, below said fixed support, and a horizontal mounting plane M4 on the upper side of fixed support 30 and a horizontal mounting plane M5 below said fixed support. Each of these horizontal mounting planes M2, M3, M4, M5 is offset "downward" relative to horizontal mounting plane M1, i.e. toward standing surface 11.

Figure 2:
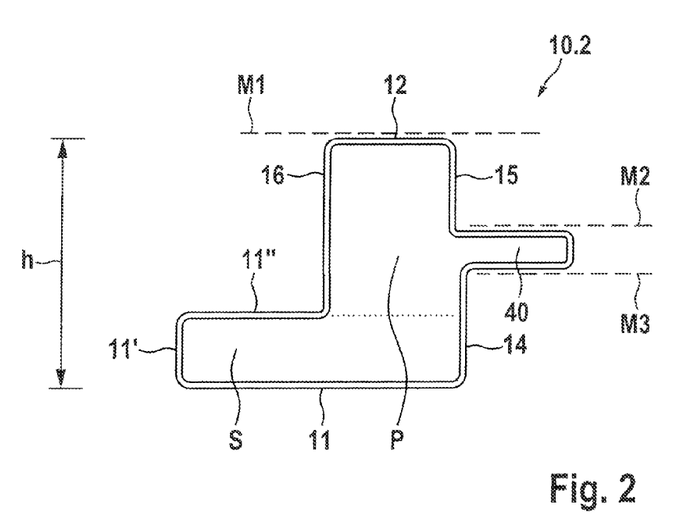
FIG. 2 a cross-sectional view of a second embodiment of a horizontal frame profile according to the present disclosure.

FIG. 2 shows a cross-sectional view of a second embodiment of a horizontal frame profile according to the present disclosure. As with the embodiment of FIG. 1, horizontal frame profile 10.2 has a first profile side 11, which once again forms a standing surface on a floor surface. Spaced therefrom, another profile side 12 extends substantially parallel to profile side 11, with the distance between profile sides 11, 12 defining the height h of horizontal frame profile 10.2. Once again, profile side 12 defines a first horizontal mounting plane M1. Horizontal frame profile 10.2 is again embodied as a hollow profile having a substantially rectangular profile chamber P, from which in this case a base S protrudes, which has a standing surface, namely profile side 11, and a bearing surface, namely profile side 11", extending parallel thereto. Standing surface 11 and bearing surface 11"

are joined by a perpendicularly extending profile side 11'. In addition, extending upward from standing surface 11 is a profile side 14, which leads to a fixed support 40 extending perpendicular thereto, the upper and lower sides of which define additional horizontal mounting planes M2 and M3, respectively. Fixed support 40 is formed as a hollow profile, comparable to fixed support 30 of FIG. 1, and merges into a profile side 15, which is aligned substantially with profile side 14 and leads at a right angle into profile side 12. Base S, the standing surface 11 of which extends widthwise beyond the width of profile chamber P, gives horizontal frame profile 10.2 particular stability. Nevertheless, it may be that not all the horizontal frame profiles of a rack are embodied as shown in FIG. 2, for example; instead, horizontal frame profiles may be combined, so that a base assembly may be formed, e.g. from two frame profiles 10.2 of FIG. 2 situated opposite one another and two additional horizontal frame profiles of a different type extending perpendicular thereto.

Figure 3:
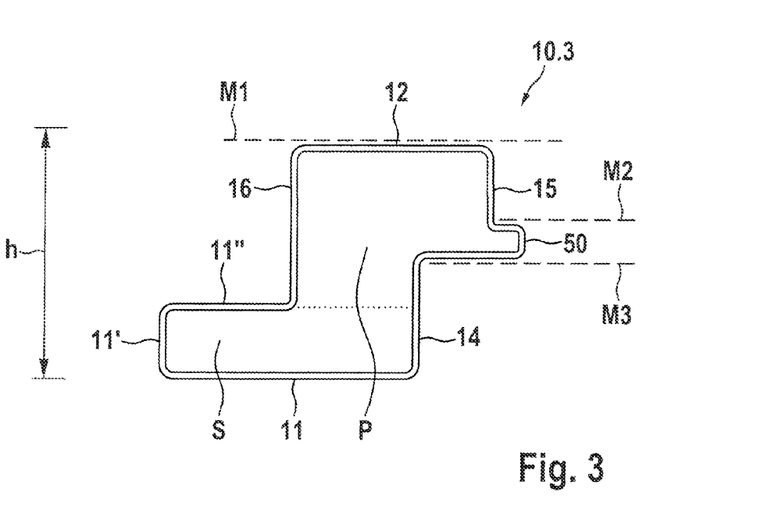
FIG. 3 a cross-sectional view of a third embodiment of a horizontal frame profile according to the present disclosure.

FIG. 3 shows a cross-sectional view of a third embodiment of a horizontal frame profile 10.3 of a base assembly according to the present disclosure, which is a variant of the embodiment of frame profile 10.2 of FIG. 2. The shape of profile chamber P is modified, and in this case is substantially perpendicular rather than rectangular. To achieve this, profile side 12 is extended widthwise with respect to horizontal frame profile 10.2, so that, unlike in FIG. 2, it extends out beyond vertically extending profile side 14. Accordingly, a fixed support 50 disposed perpendicular to profile side 14 is shortened relative to fixed support 40 of FIG. 2, however horizontal mounting planes M2 and M3 on the upper and lower sides, respectively, of fixed support 50 are maintained, with a suitable addition of fastening receptacles. Bearing surface 11" is likewise maintained as an additional horizontal mounting plane.

Apart from providing horizontal mounting planes M2, M3, fixed supports 20, 30, 40, 50 can perform additional functions, for example acting as rain gutters (particularly fixed support 20 of FIG. 1), or as sealing edges for receiving push-on seals, or as sealing surfaces, which particularly facilitates the stringing together of switchgear cabinets that are based on a base assembly according to the disclosure.

Figure 4:
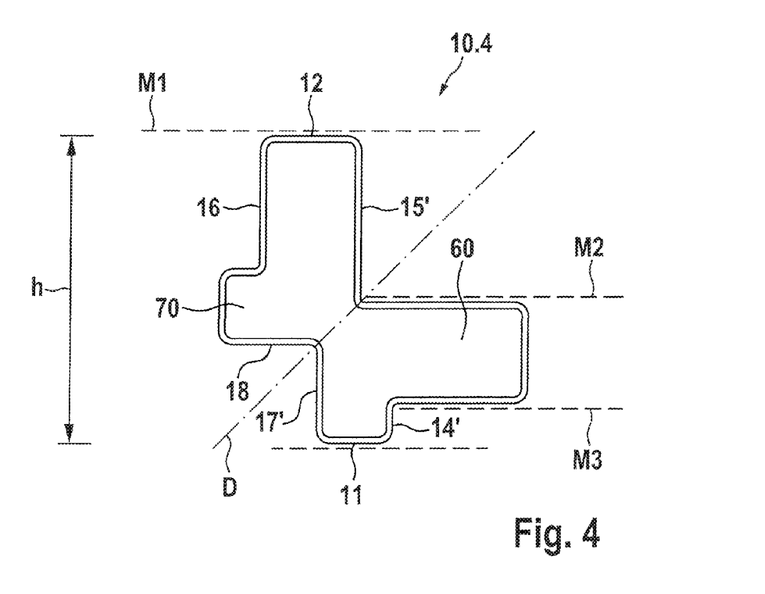
FIG. 4 a cross-sectional view of a fourth embodiment of a horizontal frame profile according to the present disclosure.

FIG. 4 shows a cross-sectional view of a fourth embodiment of a horizontal frame profile 10.4 for a base assembly according to the present disclosure, which is once again formed as a single-chamber hollow profile, but is configured as symmetrical with respect to a profile diagonal D. Profile side 11, which defines the standing surface of horizontal frame profile 10.4, is smaller than in the embodiments of FIGS. 1 to 3. Joined to this is a relatively short transition region 14', which merges into a fixed support 60, the upper and lower sides of which define horizontal mounting planes M2 and M3, respectively. On the opposite side, profile side 11 merges at a right angle into profile side 17' and then into a fixed support section 18, substantially perpendicular thereto, which defines a part of a fixed support 70. Profile side 17' and fixed support section 18 define an undercut having a substantially square cross-section, which can be used to accommodate cables, leads and the like. This offers advantages particularly in a modular attachment situation, in which fixed support 70 is situated opposite the same type of or a similar fixed support of another horizontal profile (for example, fixed support 90 of horizontal profile 10.7 according to FIG. 9). Fixed support 70 merges into a profile side 16 and then into profile side 12, the distance of which from profile side 11 defines the height h of horizontal frame profile 10.4. Profile side 15', which joins at a right angle with profile side 12, in turn joins at a right angle with horizontal mounting plane M2. Profile side 15' may optionally have fastening receptacles.

Thus with all of the above-described embodiments of horizontal frame profiles that may be used in the present disclosure, an extremely wide range of mounting and supporting options are provided, including attachment to the base group from the outside if desired.

Figure 5:
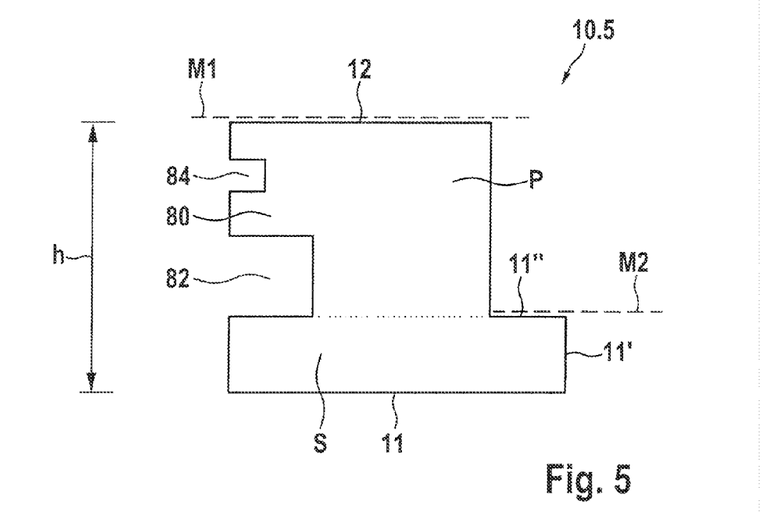
FIG. 5 a cross-sectional view of a fifth embodiment of a horizontal frame profile according to the present disclosure.

FIG. 5 shows a cross-sectional view of another embodiment of a horizontal frame profile 10.5 for a base assembly according to the present disclosure. Once again, frame profile 10.5 is embodied as a hollow profile, with a base S connected to a profile chamber P. Profile side 11 of this base offers an enlarged standing surface, similarly to the embodiments of FIGS. 2 and 3, and parallel thereto a bearing surface 11" is again provided, which defines an additional horizontal mounting plane M2 that can be used for the interior fittings of the base assembly. Standing surface 11 and bearing surface 11" are connected to one another by a profile section 11' that extends perpendicular to these. Horizontal frame profile 10.5 has a profile chamber P with a perpendicular cross-section, wherein between base S and a projection 80 a recess 82 is formed, into which the bent edge of a flat element used for lining the rack, for example, can engage. To ensure effective shielding from dust and moisture, above projection 80 a groove 84 is introduced, into which a seal can be inserted, adhesively bonded, injected, etc.

Figure 6:
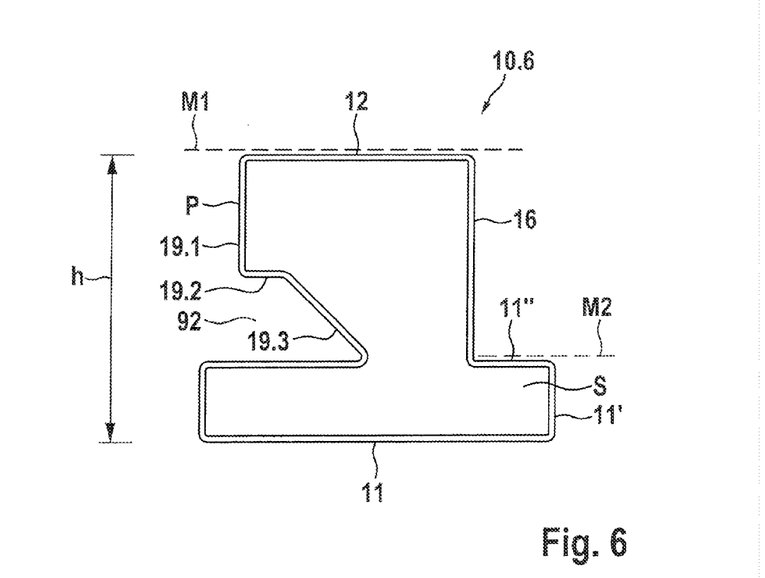
FIG. 6 a cross-sectional view of a sixth embodiment of a horizontal frame profile according to the present disclosure.

A variant of this frame profile is shown in FIG. 6. In this horizontal frame profile 10.6, also embodied as a hollow profile, a profile chamber P merges into a base S, the width of base S being greater than the greatest width of profile chamber P, and base S projecting widthwise in both directions beyond profile chamber P. Thus profile side 11 of base S provides a standing surface that corresponds to that of the embodiment of FIG. 5, and parallel to standing surface 11, a bearing surface 11' is provided, which defines a horizontal mounting plane M2. Standing surface 11 and bearing surface 11" are connected to one another by a profile section 11'. Bearing surface 11" merges into a profile side 16, which extends at a right angle thereto and which continues into profile side 12, which defines the first horizontal mounting plane M1. A first profile side segment 19.1 adjoins profile side 12, extending perpendicular thereto; adjoining this and extending perpendicular thereto is a second profile side segment 19.2, and adjoining profile side segment 19.2 and extending diagonally thereto, at an angle of approximately 135°, is a third profile side segment 19.3, which leads to the upper side of base S. A recess 92 is thereby also formed here, into which a bent edge of a flat component can be inserted. If a seal is desired, it may be sprayed onto profile side segment 19.1.

Figure 7:
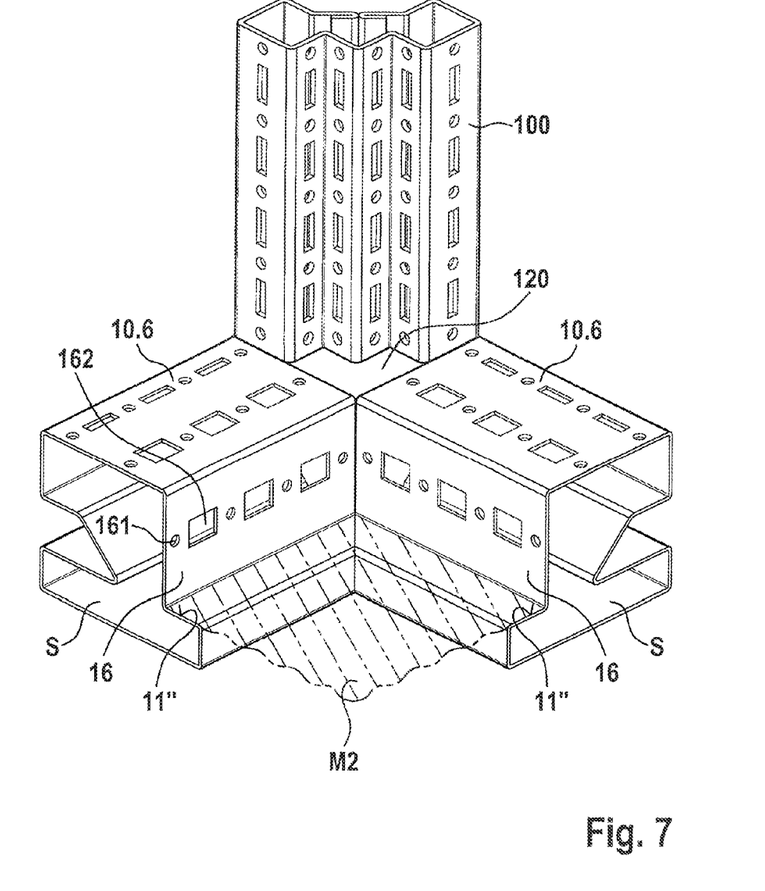
FIG. 7 a perspective view of a corner region with horizontal frame profiles according to FIG. 6.

FIG. 7 shows the corner region of a rack, in which horizontal frame profiles according to the embodiment of FIG. 6 are used for the base assembly. The two horizontal frame profiles 10.6 are connected to a vertical frame profile 100 by means of a corner piece 120, which will not be described in detail here. Vertical frame profiles and corner pieces of known embodiments are suitable. Horizontal frame profiles 10.6 in the example shown are cut to length such that they meet at the corner piece 120 and abut flush with one another, so that particularly the horizontal mounting planes M2 of the two frame profiles 10.6 are aligned. The continuous extension of bearing surface 11" from one of horizontal frame profiles 10.6 to another thus creates a bearing frame that can be used for the interior fittings of the base region of a rack. In addition, fastening receptacles 161, 162 are introduced here by way of example in profile sides 16, which correspond to the customary system of holes in a frame profile and can be used for mounting an interior fitting component, for example a mounting rail, a chassis, a cable routing track or the like, and may also be used for base plates.

Figure 8:
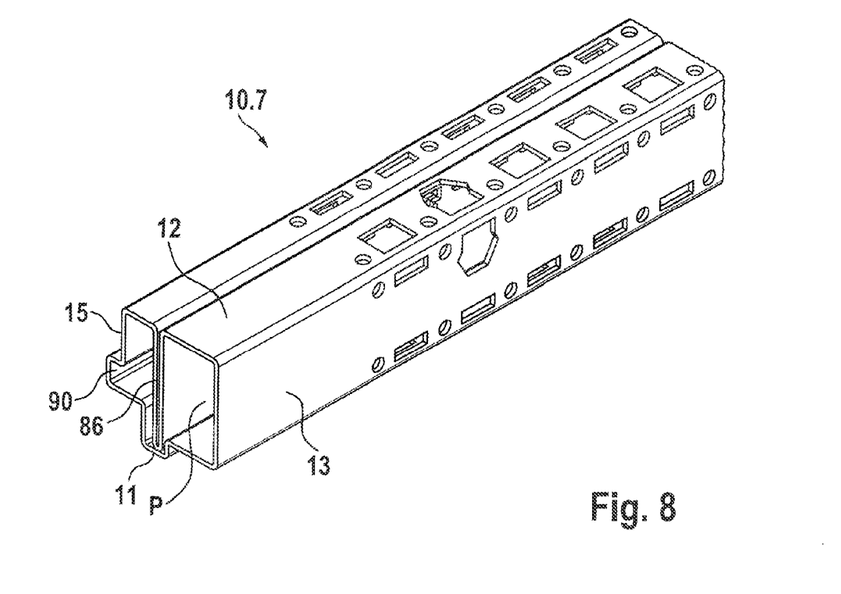
FIG. 8 a perspective view of a horizontal frame profile, in which the profile chamber is equipped with a partition-like reinforcement brace.
Figure 9:
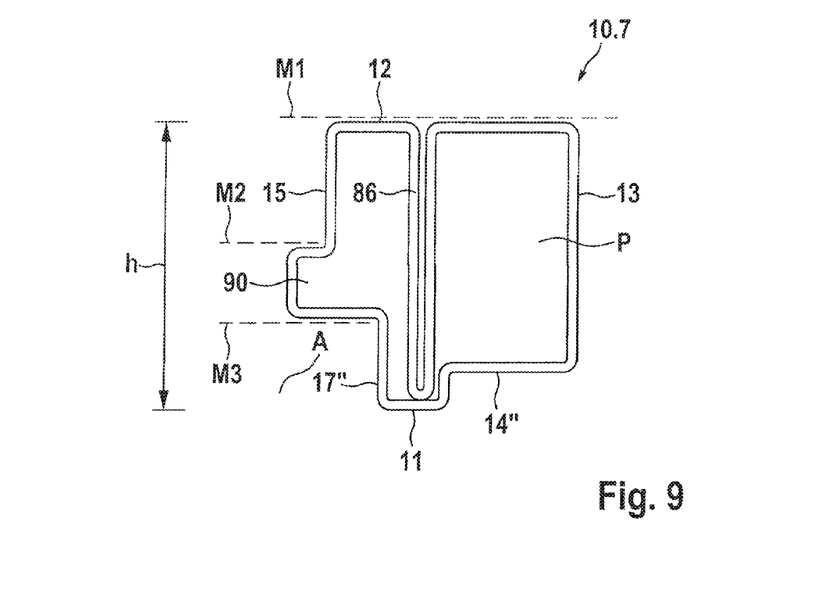
FIG. 9 a cross-sectional view of the profile of FIG. 9.

These interior fitting options are also provided by the above-described profile geometries and by the profile geometry according to FIGS. 8 and 9, as long as the corresponding fastening receptacles are provided.

FIG. 8, which is meant to be considered together with FIG. 9, shows a perspective view of an additional horizontal frame profile 10.7, which is particularly suitable for applications in which the load strength of the frame profile is a significant factor. Profile chamber P of horizontal frame profile 10.7 is divided lengthwise by a reinforcing brace 86 extending in the vertical direction up to profile side 11, which forms the standing surface of frame profile 10.7.

The profile geometry of horizontal frame profile 10.7 is illustrated more clearly in the cross-sectional view of FIG. 9. The profile sheet of profile side 12 is drawn into profile chamber P with a foldover of 180°, producing a reinforcing brace 86 made of a double layer of profile sheet, supported against profile side 11. This serves to ensure that, even when heavy loads are applied to profile side 12, no deformation of the profile geometry will occur. It also enables the mounting options for the mounting plane of M1 to be fully utilized for heavy loads. Adjoining profile side 12, extending perpendicularly thereto, is a profile side 1, which leads to a fixed support 90, the upper and lower sides of which define horizontally extending mounting planes M2 and M3, respectively. Below fixed support 90, similarly to the embodiment of FIG. 4, a recess A is provided between mounting plane M3 and profile side segment 17″, which is perpendicular thereto, in which cables, lines and the like may be routed; in this case as well, the cables or lines may be secured by means of fastening receptacles (not shown) provided in mounting plane M3, for example by means of clips that are latched in the fastening receptacles. Profile side 11 transitions via a stepped section 14″ into a profile side 13, which forms the outer side of horizontal frame profile 10.7.

Figure 10:
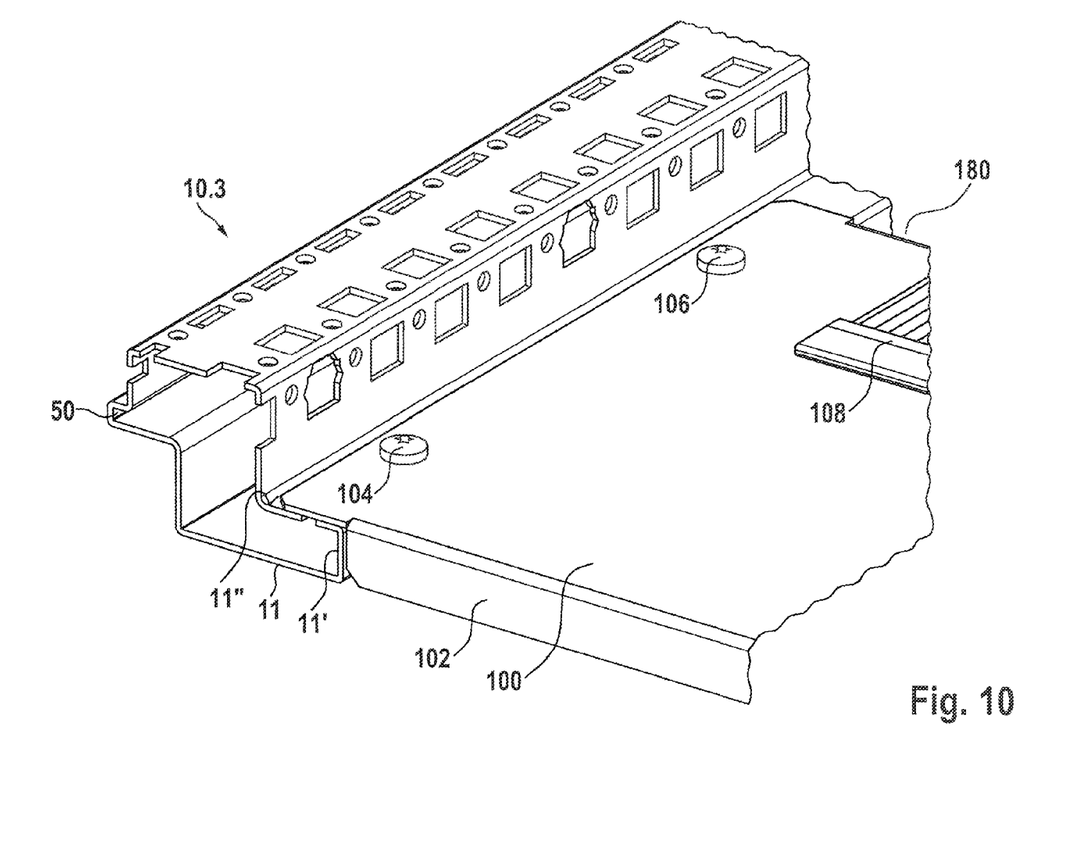
FIG. 10 a partial perspective view of a horizontal profile according to FIG. 3 with mounted base plate.

FIG. 10 shows a perspective partial view of a base assembly according to the present disclosure, in which horizontal frame profile 10.3 according to FIG. 3 is used, in this case in combination with a base plate 100, which at least partially covers base section 180 of a rack.

Base plate 100 has a bent edge 102, the length of which corresponds to the height of profile section 11′ of horizontal frame profile 10.3, resulting overall in an end that is flush with profile side 11 as the standing surface. Base plate 100 is fixed by means of two screws 104, 106 in fastening receptacles of bearing surface 11″, and base plate 100 further has a recess (not shown) in which a brush strip 108 is attached to enable a cable to be fed in from below base plate 100. The configurations of the horizontal frame profiles according to the present disclosure, as described above by way of example, thus enable base plates to be mounted directly on the profile without requiring a base frame or a base tray for this purpose.

Figure 11:
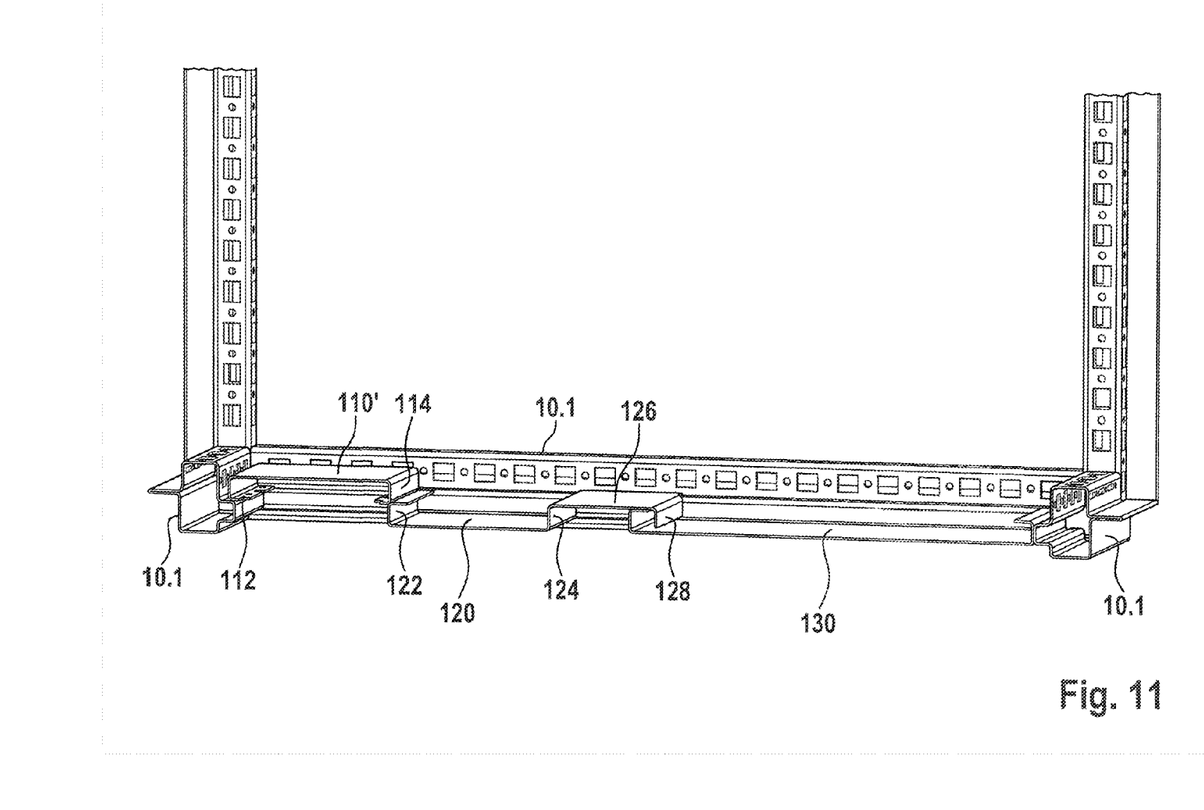
FIG. 11 a partial view of a base assembly according to the present disclosure with various base plate installation options.

A plurality of designs of base panels or base plates are possible, as illustrated in FIG. 11. In the embodiment of a rack illustrated here, horizontal frame profiles 10.1 according to the embodiment of FIG. 1 are used. In this case, rather than using fixed support 20 with its fastening options, fixed support 30 is used, which defines mounting planes M4 and M5 (FIG. 1).

Figure 12:
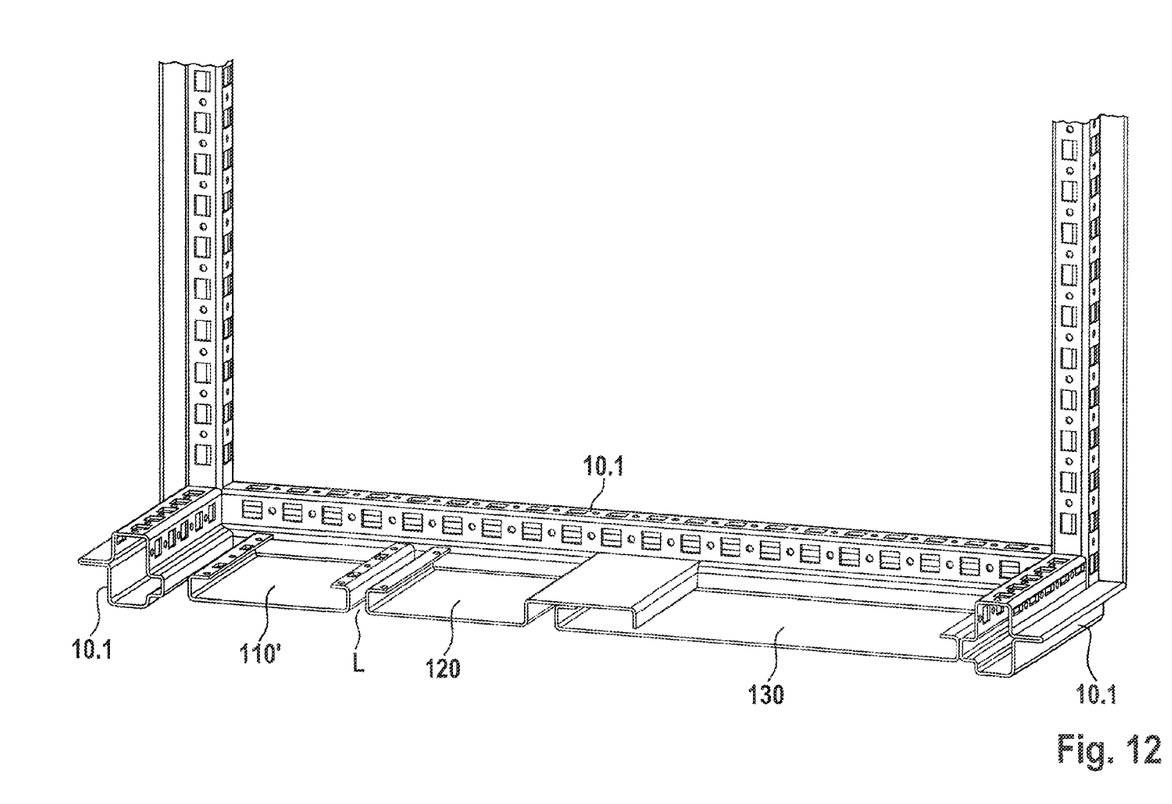
FIG. 12 a partial view of a base assembly according to the present disclosure with base plates prepared for cable insertion.
Figure 13:
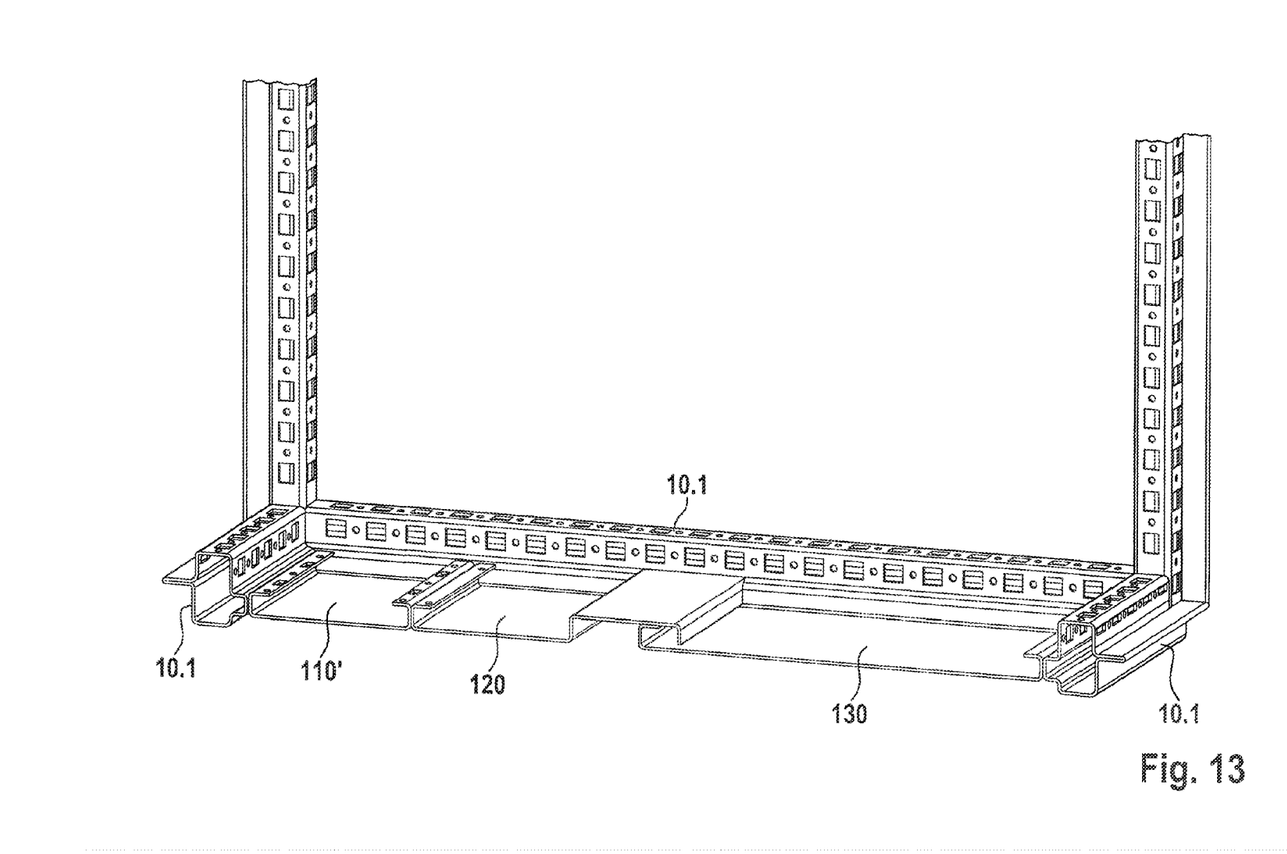
FIG. 13 a variant of the base assembly according to FIG. 12.

The arrangement of FIG. 11 illustrates how base plates 110, 120, 130 may be configured in various planes. Base plate 110, which is provided on two opposing sides with an edge with multiple bent corners 112, 114, is seated with its free end in mounting plane M4 thus forming an open space that can be used for cable insertion and also for separating cables in the case of different types of power. Alternatively, an additional base plate in the form of a tray may be fastened "upside-down" so to speak, with its flat bent edge in mounting plane M5, forming an at least partially enclosed space between the base plates. Thus the configuration of base plates 110 as support plates allows variable installation. Another base plate 120 has a double-bent edge 122 at one free end, which is spaced from an opposite end with a single-bent edge 124 that continues into a step-like raised surface 126. When combined with a single-bent edge 128, this results in a region of base plate 120 that can be slidably placed on base plate 130, with its sliding movement being limited by bent edges 124 and 128. With this configuration, which is illustrated more clearly by a combination of FIGS. 12 and 13, a gap L can be produced between base plate 110′ and base plate 120, for example, by shifting base plate 120 over base plate 130. Cables can be fed through this gap L, and then base plate 120 can be moved toward base plate 110′ so that gap L is kept very small, thereby preventing dirt and moisture from penetrating.

Figure 14:
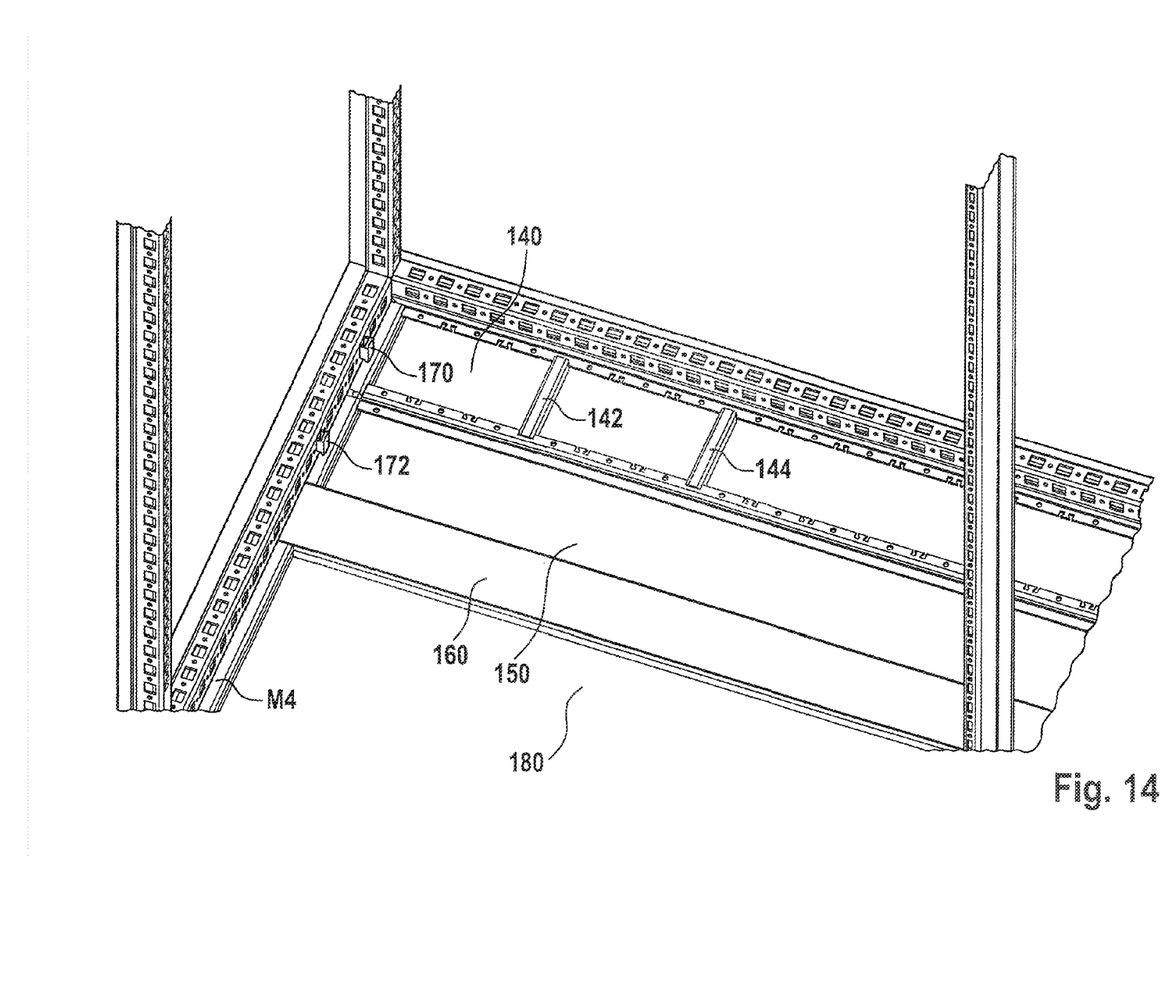
FIG. 14 a partial view of a base assembly with tray-like base plates.

FIG. 14 shows a combination of two base plates 140, 150 extending toward a horizontal frame profile 10.1, in which the plates are prevented from shifting laterally by an end piece 160, and the plates partially cover the base section 180 of a base assembly. Base plates 140, 150 and end piece 160 are fixed in mounting plane M4. Base plate 140 is equipped with divider braces 142, 144, which can be fixed at different positions on base plate 140, for which purpose suitable fastening receptacles are provided along bent edges of base plate 140. If the braces are simply hooked into place, divider braces 142, 144 can be repositioned at any time as needed and thus create separate shelf areas, for example for spare cable.

Figure 15:
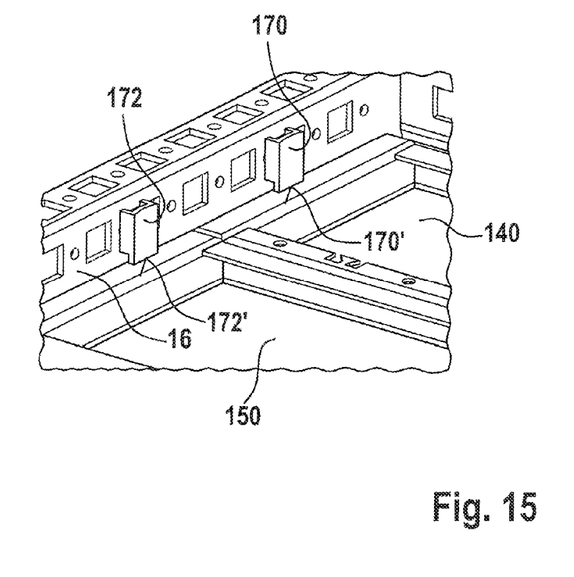
FIG. 15 a detail view showing the fastening of the base plates on the horizontal frame profile of the base assembly.

Base plates 140, 150 are secured by means of snap-engaged, self-locking clamping elements 170, 172, as is most clearly shown at the top of FIG. 15. Clamping elements 170, 172 are inserted into fastening receptacles in the system of holes provided in a vertical profile side 16 of a horizontal frame profile, and are seated with one contact face 170′, 172′ resting on the bent edges of base plates 140, 150. This enables tool-free assembly, allowing the cabinet to be reconfigured easily.

The features of the disclosure disclosed in the foregoing description, in the drawings and in the claims are considered to be essential both individually and in any combination to the implementation of the disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A base assembly for a rack of a switchgear cabinet, comprising:

horizontal frame profiles which have the height h and which surround a base section of the rack, wherein:

at a height h, each frame profiles have a first horizontal mounting plane;

spaced from the first horizontal mounting plane on one or more of the frame profiles, at least one additional mounting plane is provided on or adjoining a fixed support which is formed at least sectionally on the one or more of the frame profiles and projects into the base section;

the one or more of the horizontal frame profiles has a profile chamber with a base protruding therefrom, which has a standing surface and a bearing surface;

at least the standing surface extends beyond a width of the profile chamber in at least one widthwise direction and the standing surface and the bearing surface extend parallel to one another;

a horizontal mounting plane is located on the bearing surface, and the standing surface and the bearing surface are connected to one another via a perpendicularly extending profile side; and the horizontal frame profiles are hollow profiles and the standing surface of the horizontal frame profiles has fastening receptacles, wherein the two of the frame profiles are joined in a corner region of a rack to a vertical frame profile by means of a corner piece, wherein the two frame profiles are cut to length such that they meet at the corner piece and abut flush with one another, so that the additional mounting planes of the two frame profiles are aligned with one another, and thus the bearing surface of one of the two frame profiles is extended continuously to the bearing surface of the other one of the two frame profiles, creating a bearing frame.

2. The base assembly according to claim 1, wherein at least one of the additional mounting planes extends parallel to the first horizontal mounting plane.

3. The base assembly according to claim 1, wherein the fixed support is formed on the horizontal frame profiles around the entire base perimeter.

4. The base assembly according to claim 1, wherein the fixed support is formed by a profile sheet that is folded over 180°.

5. The base assembly according to claim 1, wherein the fixed support is formed as a hollow profile by at least one bend in a profile sheet.

6. The base assembly according to claim 1, wherein two horizontal mounting planes are formed on the fixed support.

7. The base assembly according to claim 6, wherein the horizontal mounting planes of the fixed support extend parallel to one another and parallel to the first mounting plane.

8. The base assembly according to claim 1, wherein the horizontal mounting planes have fastening receptacles.

9. The base assembly according to claim 1, wherein at least one of the horizontal frame profiles has a profile chamber which is divided by a vertically extending reinforcing brace.

10. The base assembly according to claim 1, wherein an interior fitting component is secured in at least one of the additional mounting planes.

11. The base assembly according to claim 10, wherein the interior fitting component is a mounting rail, a chassis, or a cable routing track.

12. The base assembly according to claim 10, wherein the interior fitting component is a base plate for partially or completely covering the base section.

13. The base assembly according to claim 12, wherein the base plate is bent along at least one of its sides.

14. The base assembly according to claim 12, wherein at least two base plates are provided, slidably attached to one another.

15. The base assembly according to claim 14, wherein one of the base plates extends over another base plate.

16. The base assembly according to claim 12, wherein base plates are attached in at least two additional mounting planes, forming an at least partially enclosed space between the base plates.

17. The base assembly according to claim 12, wherein the base plate has at least one relocatable divider brace that subdivides the base plate.

18. The base assembly according to claim 12, wherein the base plate is in the form of a tray.

19. The base assembly according to claim 13, wherein at least two base plates are provided, slidably attached to one another.

20. The base assembly according to claim 13, wherein the base plate is in the form of a tray.

21. A base assembly for a rack of a switchgear cabinet comprising:

a plurality of horizontal frame profiles adjacent to a base section of the rack, each one of the horizontal frame profiles including:

sidewalls defining a hollow profile chamber;

a first horizontal mounting plane at an upper surface that is at a maximum height of the horizontal frame profile;

a fixed support extending from the chamber;

a second horizontal mounting plane at the fixed support;

a base extending from the chamber;

a standing surface of the base provides a standing surface of the horizontal frame profile, the standing surface extends continuously along a length of the horizontal frame profile;

a bearing surface of the base is opposite to the standing surface;

a third horizontal mounting plane is at the bearing surface;

a plurality of fastening receptacles are defined by the bearing surface; and a perpendicularly extending profile side connects the standing surface to the bearing surface, the standing surface and the bearing surface are spaced apart from one another by a length of the perpendicularly extending profile side;

wherein two of the horizontal frame profiles are joined in a corner region of the rack to a vertical frame profile by way of a corner piece; and the horizontal frame profiles are cut to length such that they meet at the corner piece and abut flush with one another, so that the second mounting planes of the two horizontal frame profiles are aligned with one another, and thus the bearing surface of one of the two horizontal frame profiles is extended continuously to the bearing surface of the other of the two horizontal frame profiles, thereby creating a bearing frame.

* * * * *